United States Patent [19]

Hashinaga et al.

[11] Patent Number: 5,757,251
[45] Date of Patent: May 26, 1998

[54] ELECTRONIC COMPONENT CONTAINED IN A METAL PACKAGE

[75] Inventors: Tatsuya Hashinaga; Gaku Ishii; Kenji Otobe; Ken-ichiro Matsuzaki, all of Yokohama, Japan

[73] Assignee: Sumitomo Electric Industries, Ltd., Osaka, Japan

[21] Appl. No.: 655,162

[22] Filed: May 30, 1996

[30] Foreign Application Priority Data

May 30, 1995 [JP] Japan ................... 7-131570

[51] Int. Cl.⁶ .................. H01P 1/00; H05K 5/04
[52] U.S. Cl. ................ 333/246; 174/52.6; 361/752
[58] Field of Search .................. 333/246, 247; 361/736, 752, 756, 802; 174/52.1, 52.4, 52.6, 138 H, 138 J

[56] References Cited

U.S. PATENT DOCUMENTS

| | | | |
|---|---|---|---|
| 4,135,168 | 1/1979 | Wade | 331/108 |
| 4,227,036 | 10/1980 | Fitzgerald. | |
| 4,310,870 | 1/1982 | Kia et al. | 361/801 |
| 4,811,168 | 3/1989 | Chesnut et al. | 361/752 |
| 5,034,846 | 7/1991 | Hodge et al. | 361/752 X |
| 5,285,354 | 2/1994 | Ohsawa et al. | 361/752 |
| 5,545,848 | 8/1996 | Lin | 174/52.1 |

FOREIGN PATENT DOCUMENTS 59-143406  8/1984  Japan.

*Primary Examiner*—Paul Gensler
*Attorney, Agent, or Firm*—Cushman Darby & Cushman IP Group of Pillsbury Madison & Sutro LLP

[57] ABSTRACT

In an electronic component, an electronic circuit board having an electronic element mounted on the major surface is mounted on a metal frame. The electronic circuit board is covered with a metal lid fitted on the metal frame and contained in a metal package constituted by the metal frame and the metal lid. At least at one notched portion is formed at least at one end of the electronic circuit board. A positioning projection formed on the metal frame engages with the notched portion. The mechanical precision and electrical characteristics are improved, so that an electronic component particularly excellent in high-frequency characteristics, which can be manufactured in simple manufacturing process, can be obtained.

11 Claims, 5 Drawing Sheets

ELECTRONIC COMPONENT CONTAINED IN A METAL PACKAGE

BACKGROUND OF THE INVENTION

1. Field of the Invention

The present invention relates to an electronic component and, more particularly, to an electronic component having a structure in which an electronic circuit board having an active element, a passive element, and the like attached to an insulating substrate with a wiring pattern is contained and set in a metal package.

2. Related Background Art

In recent years, to meet requirements of size reduction and an improvement in function of electronic equipments, size reduction and an improvement in function of electronic components incorporated in electronic equipments are in progress. For example, electronic components constituted as units in which a highly integrated compact electronic circuit board is formed by attaching a very small active element or passive element called a microchip to an insulating substrate, and contained in a metal package are popularly used.

On the other hand, to achieve size reduction of such an electronic component, an improvement in mechanical precision of the electronic component itself is very important to improve the electrical characteristics. For example, in an electronic component in which an electronic circuit board with a high-frequency circuit for amplifying or modulating a video signal or a signal with a frequency higher than that of the video signal is set, only a small shift from the optimally designed attachment position of the electronic circuit board and a metal package containing the electronic circuit board causes a degradation in electrical characteristics, e.g., abnormal signal leakage or an increase in noise, or a deterioration in shield effect of the metal package.

To improve the mechanical precision, improvements in structure and manufacturing process of electronic components have been examined, as will be described below.

FIGS. 5A to 5C are perspective and plan views schematically showing the arrangement of a conventional electronic component. Referring to FIGS. 5A to 5C, the metal package of an electronic component 1A is constituted by a metal frame 2 formed by pressing a metal plate, and a cap-like metal lid 3 fitted on the metal frame 2. The metal frame 2 has a bottom portion 2a on which an electronic circuit board 4 with electronic elements 4a is mounted. Upright pieces 2b and 2c are integrally formed at two sides of the bottom portion 2a by bending fabrication. The distance between the opposing upright pieces 2b and 2c is designed to be almost equal to the length of a specific side of the electronic circuit board 4.

The conventional electronic component has the above arrangement. In assembling the electronic component, the electronic circuit board 4 is fitted between the upright pieces 2b and 2c and soldered to the metal frame 2 such that the electronic circuit board 4 contacts the bottom portion 2a, as shown in FIG. 5A. Thereafter, as shown in FIG. 5B, the cap-like metal lid 3 is fitted on the outer walls of the upright pieces 2b and 2c and integrated with the metal frame 2, thereby assembling the electronic component.

According to the structure of the electronic component, the electronic circuit board 4 is positioned by the upright pieces 2b and 2c in the soldering process. The positioning accuracy is relatively high along the direction of arrangement of the upright pieces 2b and 2c (along the X direction in FIG. 5B). However, along a direction almost perpendicular to the X direction (along the Y direction in FIG. 5B), the electronic circuit board 4 tends to undesirably shift along the Y direction before the solder is hardened. To prevent such a positional shift, the conventional electronic component uses special positioning jigs as will be described below.

As shown in FIG. 5C, engaging jigs 5a and 5b having an L-shaped section are engaged with ends of the metal frame 2, respectively. At the same time, a pair of pole-like jigs 5c and 5d are arranged to oppose the engaging jigs 5a and 5b, respectively, at the Y-direction width of the electronic circuit board 4. With this operation, the metal frame 2 and the electronic circuit board 4 are properly positioned. After the solder is hardened, these jigs 5a to 5d are removed, and the metal lid 3 is attached.

For the conventional electronic component which uses such special positioning jigs, the number of manufacturing processes increases because of the necessity of attachment/detachment of the jigs, resulting in a cumbersome operation. Additionally, to automatically control the operation of the jigs, a special manufacturing apparatus is required. Furthermore, jigs of different types must be applied in units of electronic components different in shape or size, resulting in an increase in manufacturing cost.

SUMMARY OF THE INVENTION

The present invention has been made in consideration of the above problems of the conventional art, and has as its object to provide an electronic component having a structure which can improve the mechanical precision and electrical characteristics without using any jigs and also simplify the manufacturing process.

In order to achieve the above object, according to the present invention, there is provided an electronic component comprising:

- an electronic circuit board having an electronic element mounted on a major surface thereof;
- a metal frame having the electronic circuit board mounted thereon; and
- a metal lid covering the electronic circuit board and fitted on the metal frame,
- wherein at least one notched portion is formed at least at one end of the electronic circuit board, and the metal frame has a positioning projecting portion engaging with the notched portion.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1A:
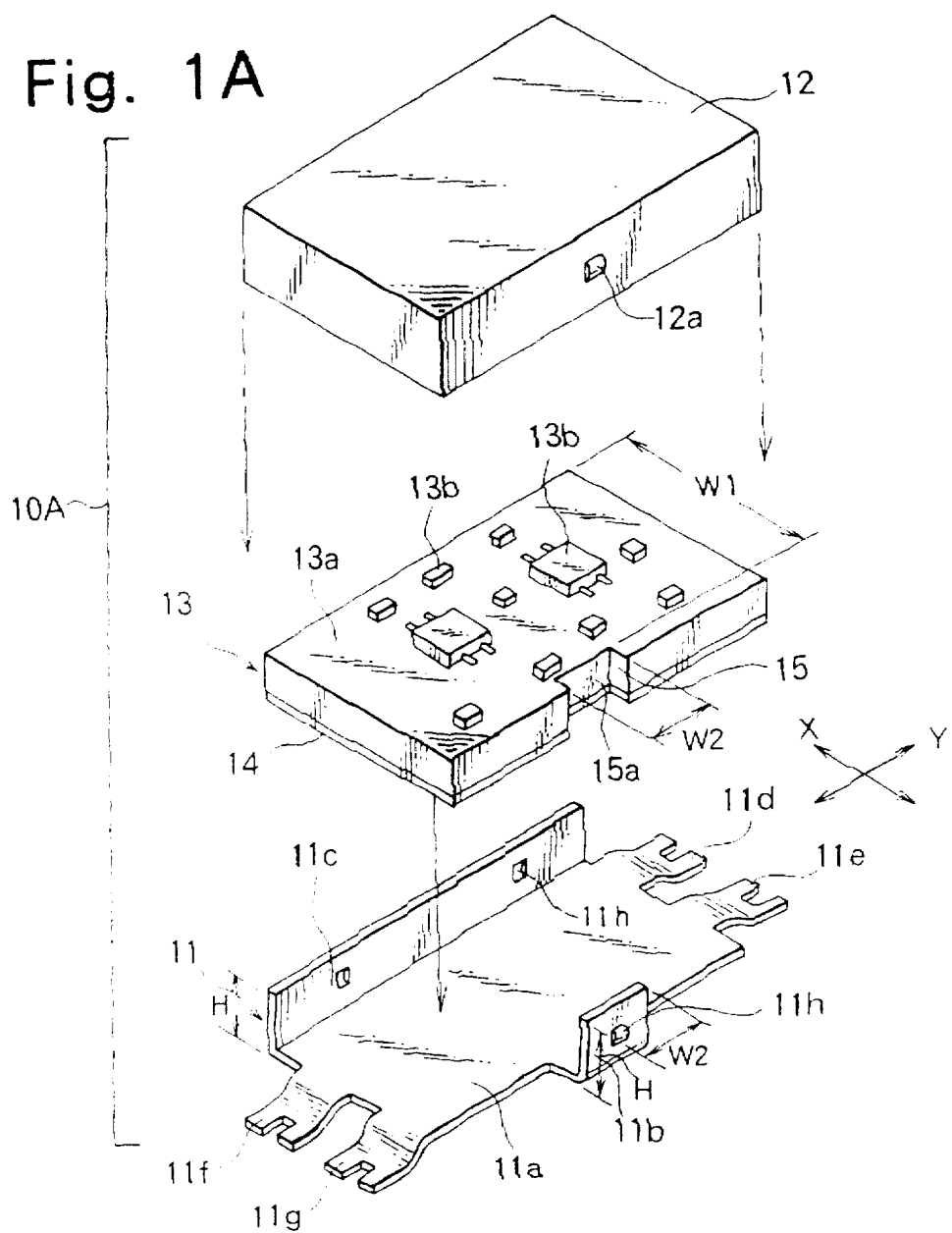
FIGS. 1A and 1B are perspective views schematically showing the arrangement of an electronic component according to the first embodiment of the present invention.

The embodiments of the present invention will be described below with reference to the accompanying drawings. The same reference numerals denote the same parts throughout the drawings, and a detailed description thereof will be omitted.

[First Embodiment]

Figure 1B:
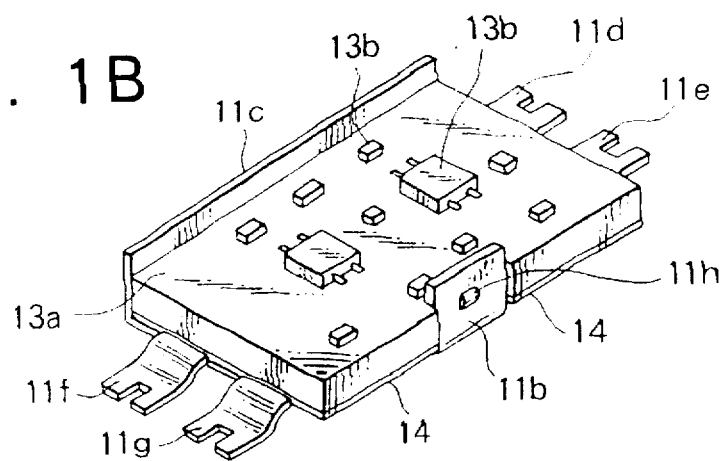

FIGS. 1A and 1B are perspective views schematically showing the arrangement of an electronic component according to the first embodiment of the present invention.

Referring to FIG. 1A, the metal package of an electronic component 10A such as a high-frequency amplifier or video amplifier is constituted by a metal frame 11 formed by pressing a metal plate, and a cap-like metal lid 12 fitted on the metal frame 11. The metal frame 11 has a bottom portion 11a on which an electronic circuit board 13 is mounted. Upright pieces 11b and 11c serving as positioning projecting portions are integrally formed at two sides of the bottom portion 11a by bending.

The distance between the opposing upright pieces 11b and 11c is designed to be almost equal to a predetermined width W1 (to be described later). The upright piece 11b is also designed to have a predetermined width W2. The upright pieces 11b and 11c are adjusted to have a predetermined height H to hold the metal lid 12 at a predetermined level. The upright pieces 11b and 11c have fitting projections 11h projecting outward to hold the metal lid 12 such that a predetermined gap is formed to prevent the side portions of the electronic circuit board 13 from contacting with the metal frame 11 and the metal lid 12. The metal lid 12 has recessed portions 12a projecting outward from the metal lid 12 and fitted on the fitting projections 11h.

The fitting projections 11h and the recessed portions 12a can have various shapes. For satisfactory fitting, the fitting projections 11h and the recessed portions 12a preferably have a rectangular or square cross section. Support pieces 11d to 11g used to solder or screw the electronic component 10A to various electronic equipments or electronic circuits are integrally formed at the end portions of the metal frame 11 along the longitudinal direction (along the Y direction in FIG. 1A) almost perpendicular to the direction of arrangement of the pair of upright pieces 11b and 11c (the X direction in FIG. 1A).

Electronic elements 13b such as active elements (e.g., field effect transistors) or passive elements (e.g., resistors, capacitors, or inductors), which are electrically connected to a predetermined printed wiring formed on an almost rectangular insulating substrate 13a consisting of, e.g., a ceramic, are mounted on the electronic circuit board 13. A metal layer 14 formed of at least one of copper (Cu), zinc (Zn), tin (Sn), lead (Pb), gold (Au), and nickel (Ni) is formed on the reverse surface of the electronic circuit board 13 with the electronic elements 13b being mounted thereon. This metal layer 14 is used to satisfactorily perform soldering to the bottom portion 11a of the metal frame 11. The metal layer 14 can also improve the high-frequency characteristics of the electronic elements 13b and also effectively improve the heat dissipation properties. The metal layer 14 can be formed on the lower surface of the electronic circuit board 13 by deposition, plating, or printing.

A rectangular notched portion 15 having the width W2 almost equal to the width of the upright piece 11b and a depth enough to receive the upright piece 11b is formed at one side of the insulating substrate 13a. The width W1 from a bottom surface 15a of the notched portion 15 to the opposing side end of the electronic circuit board 13 is almost equal to the distance between the opposing upright pieces 11b and 11c.

The positions where the upright piece 11b and the notched portion 15 are formed are set such that the electronic circuit board 13 is mounted on the bottom portion 11a of the metal frame 11 upon setting the electronic circuit board 13 in the metal frame 11.

In assembling the electronic component according to the first embodiment, the electronic circuit board 13 is fitted between the upright pieces 11b and 11c, and at the same time, the upright piece 11b is engaged with the notched portion 15, as shown in FIG. 1B. In addition, the electronic circuit board 13 is set in the metal frame 11 such that the metal layer 14 contacts the bottom portion 11a of the metal frame 11. The metal layer 14 is fixed to the metal frame 11 by so-called soldering. SnPb, AuSn, or the like can be preferably used for soldering. Subsequently, the cap-like metal lid 12 is fitted on the upright pieces 11b and 11c while engaging the recessed portion 12a of the metal lid 12 with the fitting projection 11h of the upright piece 11b. With this arrangement, the metal lid 12 is maintained at a predetermined height. At the same time, as shown in FIG. 2, the metal lid 12 is fixed while forming a predetermined gap d between the metal lid 12 (the top portion is not illustrated) and the side portions of the electronic circuit board 13, thereby completing assembly of the electronic component 10A.

Figure 2:
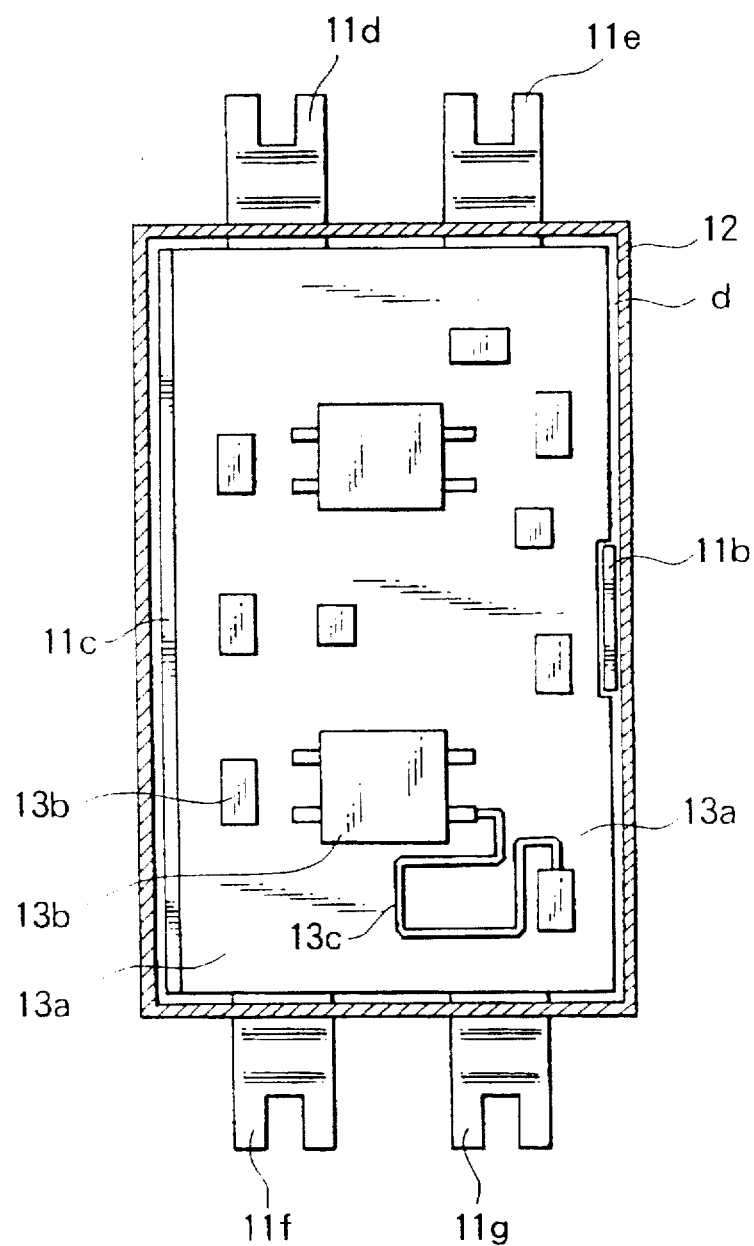
FIG. 2 is a partially cutaway plan view schematically showing the electronic component shown in FIGS. 1A and 1B.

Even when a plane waveguide such as a microstrip line 13c (only part thereof is shown in FIG. 2) is formed, the present invention can be preferably applied to obtain excellent high-frequency characteristics.

As described above, according to the first embodiment, a positioning projecting portion (i.e., the upright piece 11b) integrally formed in advance with the metal frame 11 as the constituent member of the metal package and having a predetermined height is formed and engaged with the notched portion 15 formed in advance in the electronic circuit board 13. With this structure, a relative positional shift (particularly in the Y direction) between the electronic circuit board 13 and the metal frame 11 in assembling the electronic component can be prevented. In addition, since the mechanical precision is improved, the shield effect of the metal package can be improved, and the electrical characteristics can also be improved while suppressing leakage of a high-frequency signal or generation of an abnormal distribution of magnetic flux.

Particularly, excellent high-frequency characteristics and excellent electrical characteristics for a radio wave in the quasi-microwave band, i.e., in a frequency band of, e.g., 0.5 GHz to 3 GHz can be obtained, so that a highly reliable electronic component can be obtained. In addition, no special positioning jig is required, unlike the prior art. Therefore, the assembly operation can be largely simplified.

[Second Embodiment]

Figure 3A:
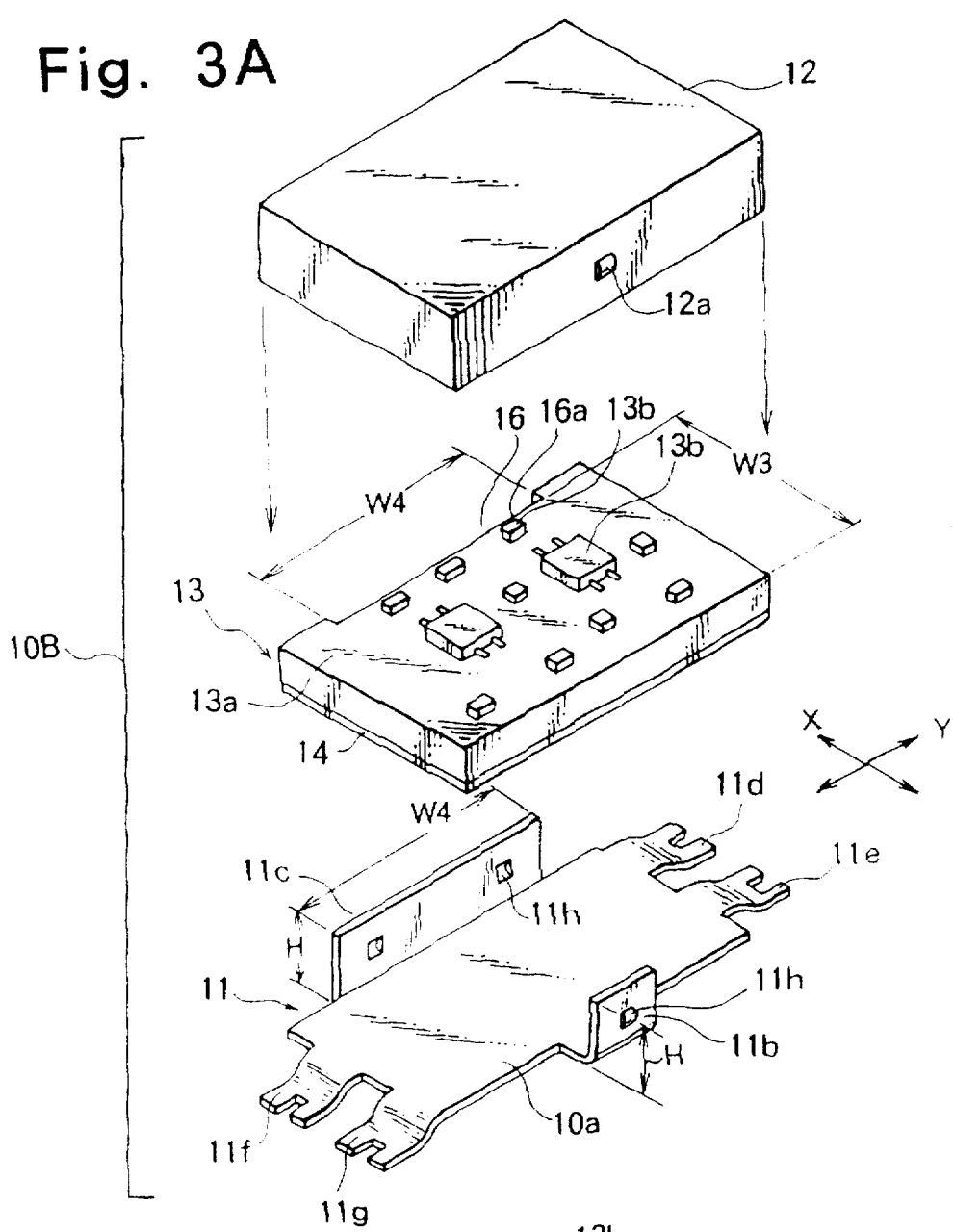
FIGS. 3A and 3B are perspective views schematically showing the arrangement of an electronic component according to the second embodiment of the present invention.
Figure 3B:
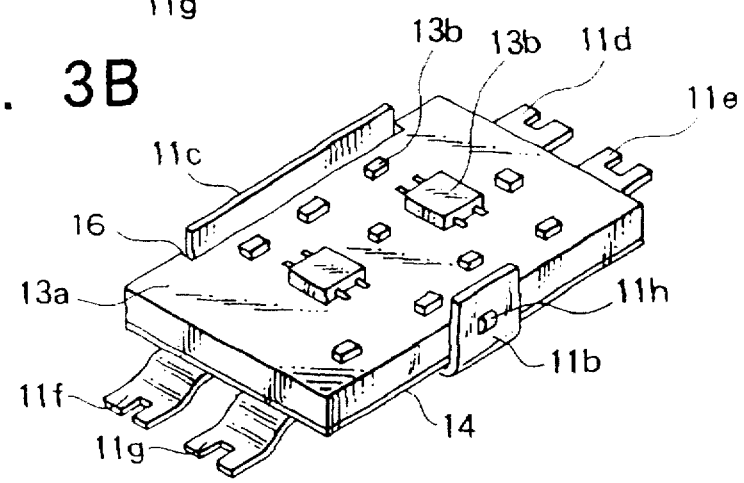

FIGS. 3A and 3B are perspective view schematically showing an electronic component according to the second embodiment of the present invention. In the first embodiment, the upright piece 11b having a small width is used. In the second embodiment, as shown in FIG. 3A, an upright piece 11c having a large width is used, and a rectangular notched portion 16 engaging with the upright piece 11c is formed in an insulating substrate 13a. More specifically, the notched portion 16 is formed at a position where the upright piece 11c is arranged when an electronic circuit board 13 is to be mounted on a metal frame 11. A width W4 of the notched portion 16 is almost equal to the width of the upright piece 11c. The notched portion 16 also has a depth enough to receive the upright piece 11c. A width W3 from a bottom surface 16a of the notched portion 16 to the opposing side of the electronic circuit board 13 is almost equal to the distance between the opposing upright pieces 11b and 11c.

The remaining arrangement of an electronic component 10B is basically the same as that of the electronic component 10A of the first embodiment.

Assembly of the electronic component 10B according to the second embodiment is performed as in the first embodiment. First, as shown in FIG. 3B, the electronic circuit board 13 having electronic elements 13b mounted thereon and a metal layer 14 formed on the reverse surface is fitted between the upright pieces 11b and 11c while engaging the upright piece 11c with the notched portion 16. The electronic circuit board 13 is set in the metal frame 11 such that the metal layer 14 contacts a bottom portion 11a of the metal frame 11. The metal layer 14 is fixed to the metal frame 11 by so-called soldering. SnPb, AuSn, or the like is used for soldering. Subsequently, a cap-like metal lid 12 is fitted on the upright pieces 11b and 11c, and a recessed portion 12a of the metal lid 12 is fitted on a fitting projecting portion 11h of the upright piece 11b. With this arrangement, the metal lid 12 is maintained at a predetermined level. At the same time, as shown in FIG. 2, the metal lid 12 is fixed while forming a predetermined gap d between the metal lid 12 and the side portions of the electronic circuit board 13, thereby completing assembly of the electronic component 10B.

As described above, according to the second embodiment, a positioning projecting portion (i.e., the upright piece 11c) integrally formed in advance with the metal frame 11 as the constituent member of the metal package is engaged with the notched portion 16 formed in advance in the electronic circuit board 13. With this structure, a relative positional shift in the X and Y directions between the electronic circuit board 13 and the metal frame 11 in assembling the electronic component 10B can be prevented. Not only the mechanical precision but also the electrical characteristics can be improved. A highly reliable electronic component particularly excellent in high-frequency characteristics can be obtained. In addition, the assembly process can be largely simplified.

[Third Embodiment]

Figure 4A:
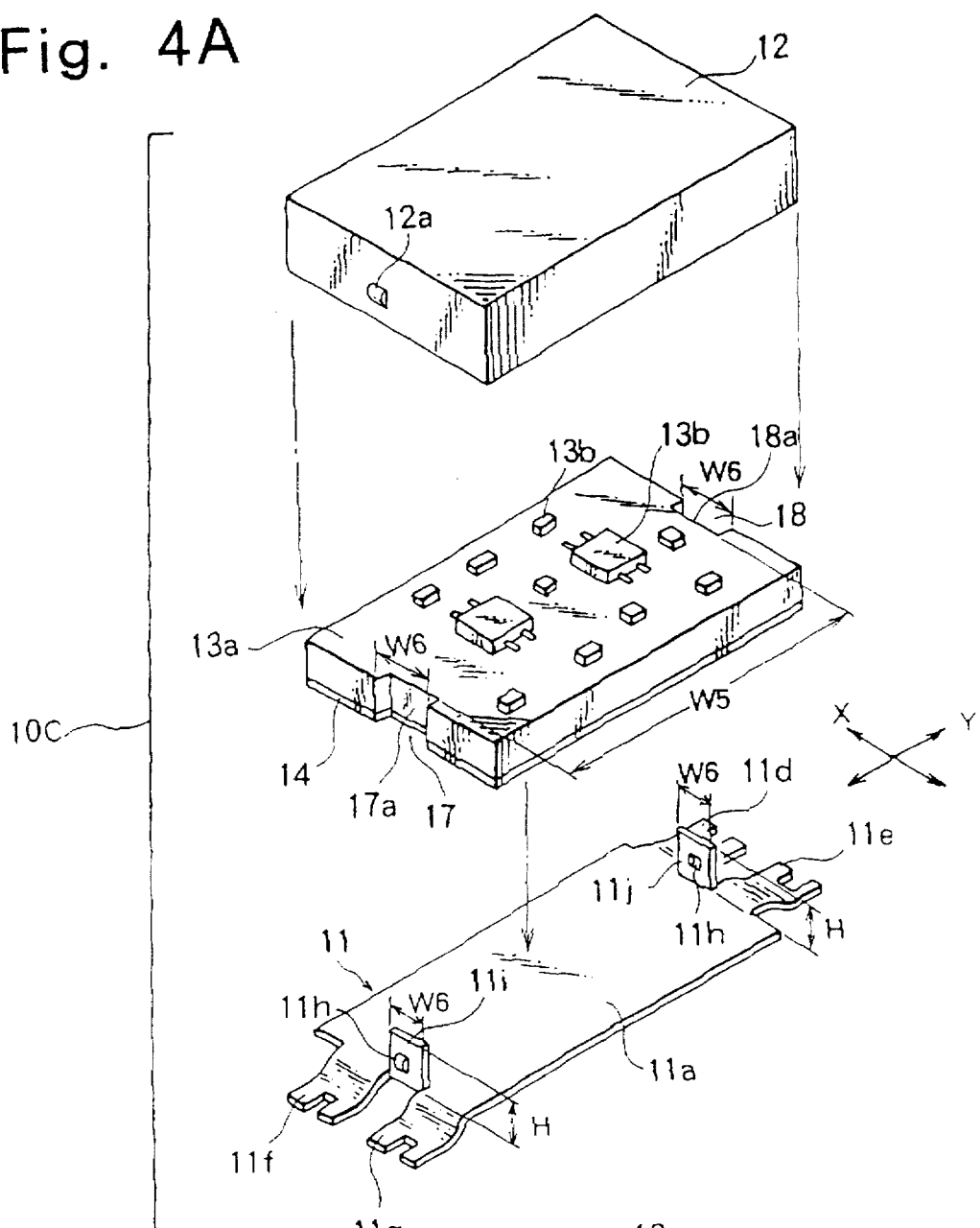
FIGS. 4A and 4B are perspective views schematically showing the arrangement of an electronic component according to the third embodiment of the present invention.
Figure 4B:
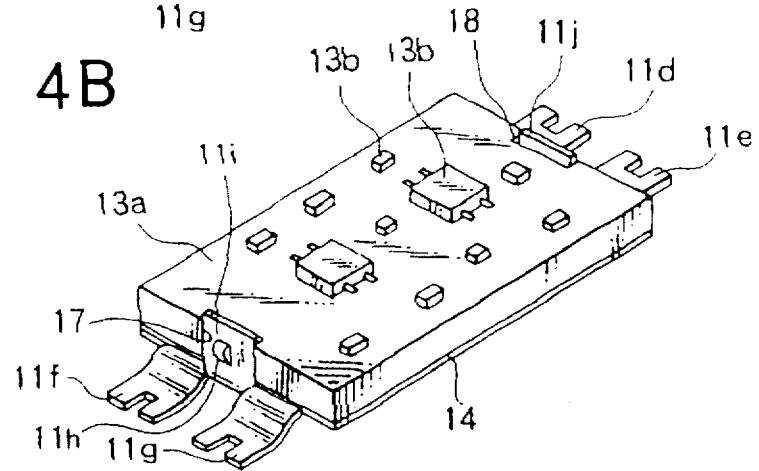
Figure 5B:
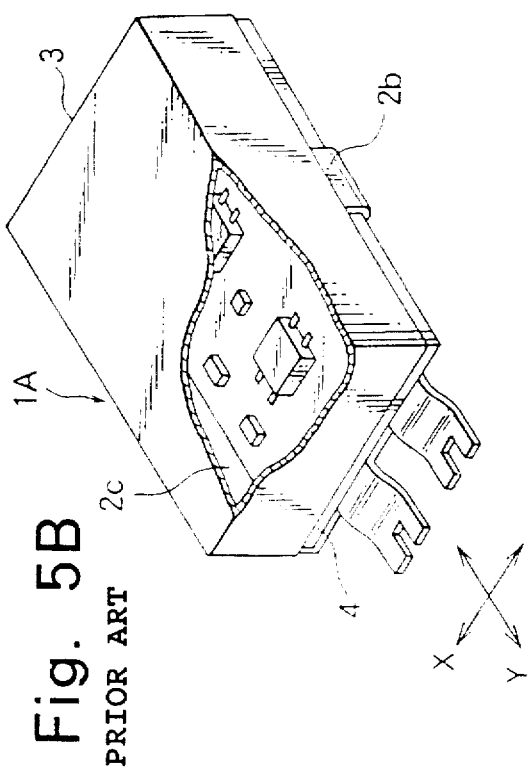
FIGS. 5A to 5C are perspective and plan views schematically showing the arrangement of a conventional electronic component.
Figure 5C:
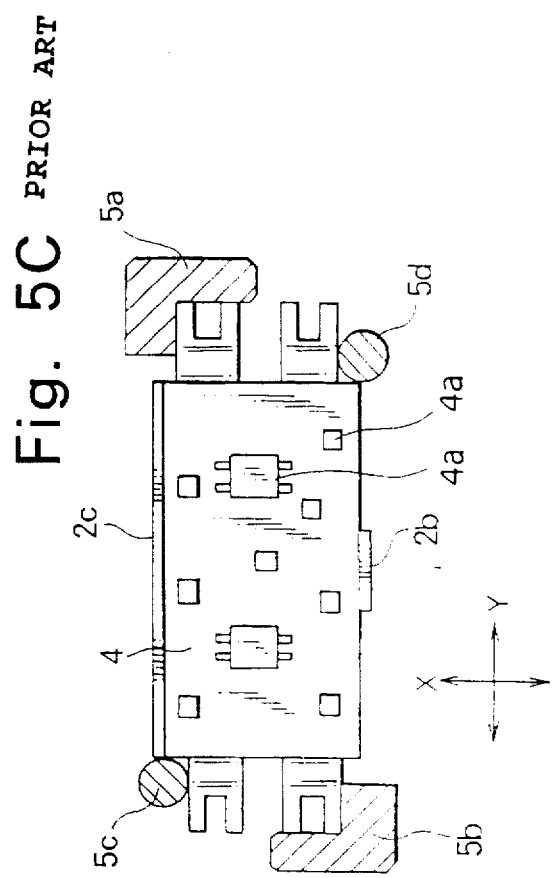
Figure 5A:
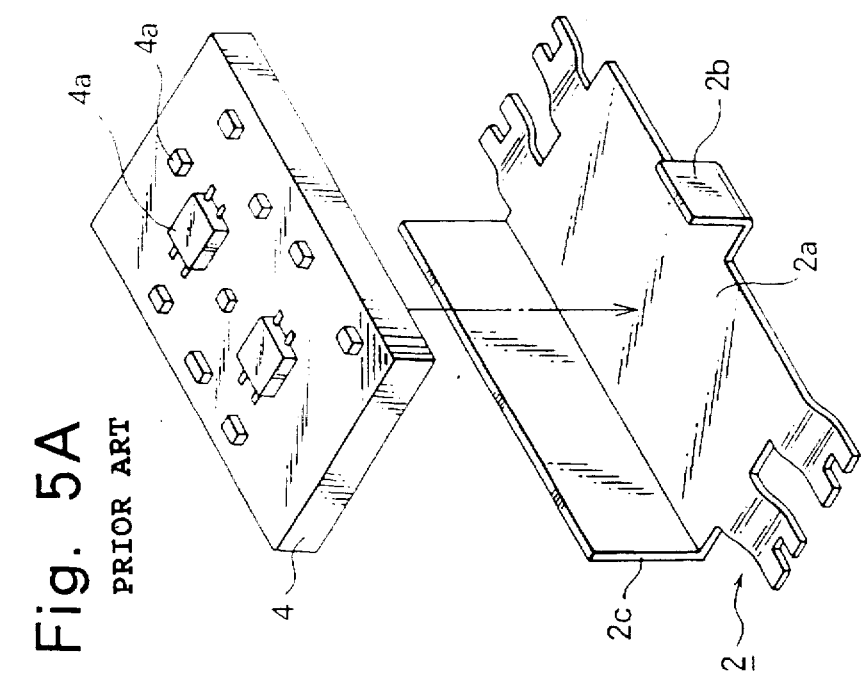

FIGS. 4A and 4B are perspective views schematically showing the arrangement of an electronic component according to the third embodiment of the present invention. As shown in FIG. 4A, upright pieces 11i and 11j are formed on a metal frame 11 along the longitudinal direction of an electronic circuit board 13 (along the Y direction in FIG. 4A). A pair of notched portions 17 and 18 are formed at the ends of the electronic circuit board 13 in correspondence with the upright pieces 11i and 11j. More specifically, a width W5 from a bottom surface 17a of the notched portion 17 to a bottom surface 18a of the notched portion 18 is almost equal to the distance between the opposing upright pieces 11i and 11j. A width W6 of the notched portion 17 is almost equal to the width W6 of the upright piece 11i. The width W6 of the notched portion 18 is almost equal to the width W6 of the upright piece 11j.

The metal frame 11 also has support pieces 11d to 11g for fixing an electronic component 10C to other electronic circuits and the like by soldering or screwing. These support pieces 11d to 11g are integrally formed with the metal frame 11 along the longitudinal direction, i.e., along the direction of arrangement of the opposing upright pieces 11i and 11j.

Assembly of the electronic component 10C according to the third embodiment is performed as in the first embodiment. First, as shown in FIG. 4B, the electronic circuit board 13 having electronic elements 13b mounted thereon and a metal layer 14 formed on the reverse surface is fitted between the upright pieces 11i and 11j while engaging the upright pieces 11i and 11j with the notched portions 17 and 18, respectively. The electronic circuit board 13 is set in the metal frame 11 such that the metal layer 14 contacts a bottom portion 11a of the metal frame 11. The metal layer 14 is fixed to the metal frame 11 by so-called soldering. SnPb, AuSn, or the like is used for soldering. Subsequently, a cap-like metal lid 12 is fitted on the upright pieces 11i and 11j, and recessed portions 12a of the metal lid 12 are fitted on fitting projections 11h of the upright pieces 11i and 11j. With this arrangement, the metal lid 12 is maintained at a predetermined level. At the same time, as shown in FIG. 2, the metal lid 12 is fixed while forming a predetermined gap d between the metal lid 12 and the side portions of the electronic circuit board 13, thereby completing assembly of the electronic component 10C.

As described above, according to the third embodiment, positioning projecting portions (i.e., the upright pieces 11i and 11j) integrally formed in advance with the metal frame 11 as the constituent member of the metal package are engaged with the notched portions 17 and 18 formed in advance in the electronic circuit board 13. With this structure, a relative positional shift in the X and Y directions between the electronic circuit board 13 and the metal frame 11 in assembling the electronic component 10C can be prevented. Not only the mechanical precision but also the electrical characteristics can be improved. A highly reliable electronic component particularly excellent in high-frequency characteristics can be obtained. In addition, the assembly process can be largely simplified.

In the above-described first to third embodiments, one notched portion or one upright piece fitted in or engaging with the notched portion is formed at each of opposing sides of the electronic circuit board 13 or the metal frame 11. However, the number of notched portions or upright pieces is not limited to one, and the present invention also includes a structure with a plurality of notched portions or upright pieces formed at each side or end. The present invention also incorporates another structure in which the notched portions or the upright pieces are formed at the corner portions of the electronic circuit board 13 or the metal frame 11. In the above description, the notched portion has a rectangular shape corresponding to the outer shape of the upright piece. However, the shape is not limited to the rectangular shape. The present invention also incorporates various shapes as far as the notched portion engages with the upright piece to prevent a relative positional shift between the electronic circuit board and the metal frame.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No.131570/1995 filed on May 30, 1995 is hereby incorporated by reference.

What is claimed is:

1. An electronic component comprising:
   an electronic circuit board having an electronic element mounted on a major surface thereof, said electronic circuit board having at least one notched portion at one end thereof;
   a metal frame on which said electronic circuit board is mounted, said metal frame having a positioning projection engaging with said notched portion to determine a position of said electronic circuit board with respect to said metal frame in a first direction, said positioning projection having a fitting projection thereon; and
   a metal lid covering said electronic circuit board and fitted on said metal frame, said metal lid having a recessed portion on a side face thereof, and said recessed portion engaging with said fitting projection to determine the position of the metal lid with respect to said circuit board in a second direction different from said first direction.

2. A component according to claim 1, wherein a metal layer formed of at least one material selected from the group consisting of copper, zinc, tin, lead, gold, and nickel is formed on a reverse surface of said electronic circuit board having said electronic element mounted thereon.

3. A component according to claim 2, wherein said metal layer is fixed to said metal frame with a solder consisting of one of SnPb and AuSn.

4. A component according to claim 1, wherein said positioning projecting portion has a height for adjusting said metal lid at a predetermined level and holding said metal lid.

5. A component according to claim 1, wherein side portions of said electronic circuit board do not contact with said metal lid.

6. A component according to claim 1, wherein said electronic element mounted on said electronic circuit board is a high-frequency electronic element.

7. A component according to claim 6, wherein a high frequency falls within a range of 0.5 GHz to 3 GHz.

8. An electronic component according to claim 1, wherein said metal frame has a base area for supporting said electronic circuit board and a standing portion located at end opposite to said positioning projection through said base area, said electronic circuit board is positioned to said metal frame by being sandwiched with said standing portion and said positioning projection in a direction perpendicular to said predetermined direction.

9. A component according to claim 8, wherein said fitting projection and the recessed portion have a rectangular cross section.

10. A component according to claim 8, wherein said fitting projection and the recessed portion have a square cross section.

11. A component according to claim 1, wherein a microstrip line is formed on said electronic circuit board.

* * * * *